United States Patent
Ogane (10) Patent No.: US 6,307,786 B1
(45) Date of Patent: Oct. 23, 2001

(54) NONVOLATILE SEMICONDUCTOR MEMORY DEVICE HAVING A HIERARCHIAL BIT LINE STRUCTURE

(75) Inventor: Junichi Ogane, Tokyo (JP)

(73) Assignee: Oki Electric Industry Co., Ltd. (JP)

( * ) Notice: Subject to any disclaimer, the term of this patent is extended or adjusted under 35 U.S.C. 154(b) by 0 days.

(21) Appl. No.: 09/652,040

(22) Filed: Aug. 31, 2000

(30) Foreign Application Priority Data

Aug. 31, 1999 (JP) .................................................. 11-244534

(51) Int. Cl.[7] .................................................. G11C 16/04
(52) U.S. Cl. ............................. 365/185.26; 365/185.01
(58) Field of Search ........................ 365/185.26, 185.05, 365/185.01, 230.06

(56) References Cited

U.S. PATENT DOCUMENTS

| | | | |
|---|---|---|---|
| 4,404,659 | * 9/1983 | Kihara et al. | 365/185 |
| 5,022,009 | * 6/1991 | Terada et al. | 365/210 |
| 5,646,886 | * 7/1997 | Brahmbhatt | 365/185.16 |
| 5,650,961 | * 7/1997 | Himeno et al. | 365/185.17 |
| 5,886,927 | * 3/1999 | Takeuchi | 365/185.22 |
| 6,005,802 | * 12/1999 | Takeuchi et al. | 365/185.02 |
| 6,144,583 | * 11/2000 | Shiba | 365/185.13 |

* cited by examiner

Primary Examiner—David Nelms
Assistant Examiner—Thong Le
(74) Attorney, Agent, or Firm—Venable; Robert J. Frank; Jeffri A. Kaminski

(57) ABSTRACT

A nonvolatile semiconductor memory device comprising a plurality of memory cells each having a transistor including a floating gate electrode as a constituent are arranged on a silicon substrate in a matrix, wherein bit lines have hierarchical structures and comprise at least a main bit line 1 and a sub-bit line 2, and a plurality of sub-bit line selection transistors 4 provided between the main bit line 1 and sub-bit line 2 which transistor 4 are respectively selectively activated depending on given row address lines, wherein a voltage applied to each gate electrode of the sub-bit line selection transistor 4 which is selected and activated when data is erased from or written on each memory cell is rendered the same as that applied to each gate electrode of the sub-bit line selection transistor 4 which becomes non-activated when not selected.

8 Claims, 7 Drawing Sheets

NONVOLATILE SEMICONDUCTOR MEMORY DEVICE HAVING A HIERARCHIAL BIT LINE STRUCTURE

BACKGROUND OF THE INVENTION

1. Field of the Invention

The invention relates to a nonvolatile semiconductor memory device having a hierarchical bit line structure wherein bit lines are formed of a main bit line and sub-bit lines.

2. Description of the Related Art

There is an electrically writable read only memory which is erasable as a block of nonvolatile semiconductor memory devices. The nonvolatile semiconductor memory device has a plurality of memory cells each of which is connected to a corresponding bit line of a plurality of bit lines.

There is currently a trend in forming nonvolatile semiconductor memory devices that bit lines are formed of a main bit line and sub-bit lines, a so-called a hierarchical bit line structure. The reason why the nonvolatile semiconductor memory device employs such a hierarchical bit line structure is to speed up the reading of data stored in a memory cell and to minimize any effect upon memory cells other than the memory cell which is being written.

In the nonvolatile semiconductor memory device having a hierarchical bit line structure, for example, 16 sub-bit lines are selectively connected to 1 main bit line via 16 sub-bit line selection transistors. In the case of a memory matrix having 256 memory cells disposed on 1 main bit line, the hierarchical bit line structure becomes as follows. For example, if bit lines are not structured hierarchically, capacitance components of diffusion layers of 256 memory cells are connected to 1 main bit line as loads. On the other hand, if the bit lines are structured hierarchically, even in the main bit line having a large load of the sub-bit lines and the main bit line, capacitance components connected to the main bit line can be reduced to the sum of capacitance components of 16 memory cells and those of sub-bit lines selection transistors.

Even in the case of writing data in a memory cell (hereinafter simply referred to as when writing data), if the bit lines are not structured hierarchically, the nonvolatile semiconductor memory device is influenced or disturbed by the number of 255 multiplied by guaranteed number of writing. On the other hand, if the bit lines are structured hierarchically, the influence of the nonvolatile semiconductor memory device can be reduced to the number of 15 multiplied by guaranteed number of writing.

Meanwhile, a very high voltage in the range of 10 to 15V is applied to a sub-bit line selection transistor in the case of erasing data from the memory cell (hereinafter referred to as when erasing data). Accordingly, there is a problem that when a thin dioxide film, such as a tunnel oxide film, of each memory cell is repeatedly used, it is electrically broken down.

Figure 9:
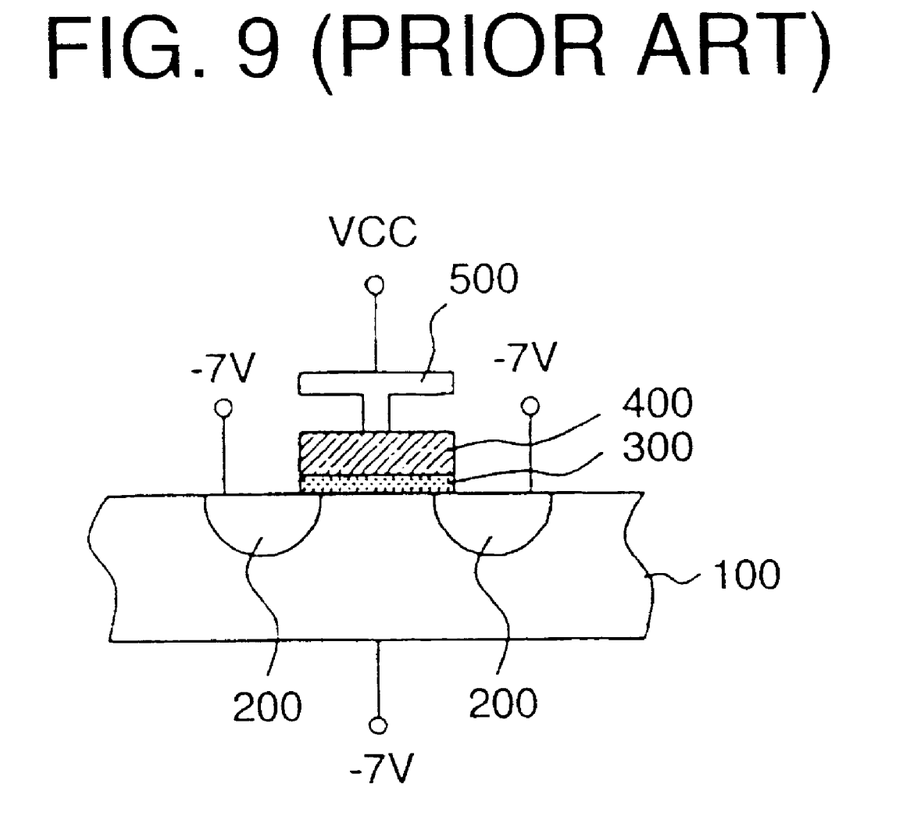
FIG. 9 is a cross sectional view of a memory cell according to a conventional nonvolatile semiconductor memory device.

FIG. 9 shows a schematic view showing a conventional semiconductor device.

In this figure, depicted by 100 is a silicon substrate, 200 is diffusion layers forming a source or a drain electrode, 300 is a gate oxide film, 400 is a first gate (floating gate), 500 is a second gate (so-called a control gate or gate electrode). A potential difference between the first gate 400 and silicon substrate 100 is VCC +7V.

To solve the foregoing problems, and to preclude the danger from electronic breakdown, the thickness of a gate oxide film of the sub-bit line selection transistor is made equal to the thickness (about 150 to 200 angstrom) of a high withstand voltage transistor used in a high voltage generation circuit or row decoder or is made to a special thickness greater than that thickness. However, in either case there is a problem that the number of processes, such as a photolithograph-etching process or oxidizing process, increases a boundary part between gate oxide films or a transistor to be formed in a memory matrix have to be made larger. As a result, an area occupied by the layout of the entire memory matrix increases in the foregoing method.

SUMMARY OF THE INVENTION

It is an object of the invention to remove the foregoing problems and another object of the invention to provide a nonvolatile semiconductor memory device capable of precluding the danger from electrical breakdown of a gate oxide film and of obtaining a hierarchical bit line structure without increasing the number of processes used to form the device.

To achieve the above objects, the nonvolatile semiconductor memory device of the invention comprises a plurality of memory cells each comprising a first transistor composed of a first electrode, a second electrode, a gate electrode, and a floating gate electrode between the gate electrode and a gate oxide film, a plurality of first bit lines each connected to the first electrode of at least one first transistor, a second bit line, a plurality of second transistors each composed of a first electrode electrically connected to any of the plurality of first bit lines, a second electrode electrically connected to the second bit line and a gate electrode to which a selection signal is inputted, and a decoder for generating a plurality of selection signals having voltage levels respectively set in response to address information. Further, the nonvolatile semiconductor memory device renders all the plurality of selection signals the same voltage level when a high voltage which is higher than a power supply voltage is applied to desired gate electrodes of a plurality of memory cells, thereby writing data on or erasing data from the memory cells. Still further, a voltage applied to the gate electrode and the first electrode of the second transistor is rendered the same as that applied to a substrate of the second transistor when a high voltage which is higher than a power supply voltage is applied to desired gate electrodes of a plurality of memory cells, thereby writing data or erasing data from the memory cells. Additionally, the thickness of the gate oxide film of the first transistor may be the same as that of the second transistor.

DESCRIPTION OF THE PREFERRED EMBODIMENTS

A nonvolatile semiconductor memory device according to a first embodiment of the invention is described in detail with reference to FIGS. 1 to 7.

Figure 1:
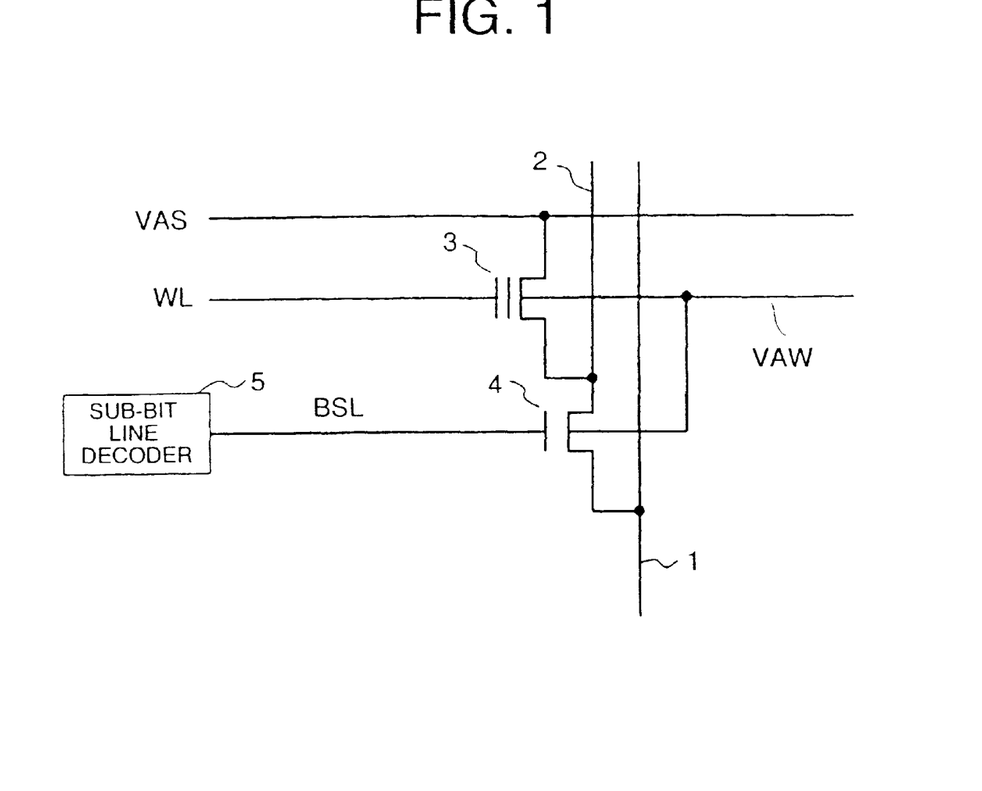
FIG. 1 is a view showing the construction of a nonvolatile semiconductor memory device according to a first embodiment of the invention.

FIG. 1 is a view showing the construction of a nonvolatile semiconductor memory device according to the first embodiment of the invention.

In this figure, a sub-bit line 2 is connected to a main bit line 1 via a sub-bit line selection transistor 4, and a plurality of memory cells 3 are connected to the sub-bit line 2 (only one memory cell 3 is illustrated in FIG. 1). A signal BSL generated by a sub-bit line selection decoder 5 is supplied to a gate electrode of the sub-bit line selection transistor 4. Voltages set in each signal during each operation mode of the nonvolatile semiconductor memory device are described in Table 1.

TABLE 1

| | reading data | erasing data | writing data |
| --- | --- | --- | --- |
| WL | Vcc level | 13 V | −8 V |
| VAS | GND level | −7 V | Hi-Z |
| VAW | GND level | −7 V | GND level |
| main bit line | 1 V | Hi-Z | 5 V/GND |
| VWP | Vcc level | Vcc level | 7 V |
| VEN | GND level | −7 V | GND level |
| BSL | Vcc/GND | −7 V | 7 V |

A signal VAW supplied to each substrate of the memory cell 3 and sub-bit line selection transistor 4 is set to the low level when reading and writing data and to −7V when erasing data. 1V is applied to the main bit line 1 when reading data and the low level or 5V is applied to the main bit line 1 when writing data, which level is differentiated depending on data to be written, and the main bit line 1 is set to a high impedance state when erasing data.

A signal VAW supplied to each substrate of the memory cell 3 and sub-bit line selection transistor 4 is set to the low level when reading and writing data and to −7V when erasing data. 1V is applied to the main bit line 1 when reading data and the low level or 5V is applied to the main bit line 1 when writing data, which level is differentiated depending on data to be written, and the main bit line 1 becomes in a high impedance state when erasing data.

Figure 2:
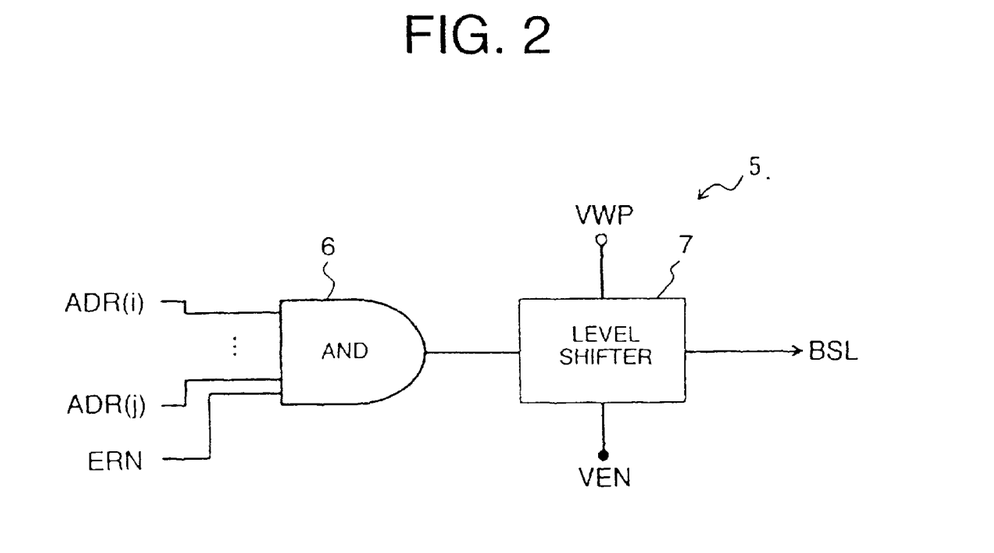
FIG. 2 is a view showing the construction of a sub-bit line selection decoder of the nonvolatile semiconductor memory device in FIG. 1.

The sub-bit line selection decoder 5 comprises, as shown in FIG. 2, and AND gate 6 for receiving row address signals ADR (i) to ADR (j) which are transmitted through a plurality of address lines and a signal ERN which becomes a low level only when erasing data, and a level shifter 7 for converting a high level of the output signal of the AND gate 6 to a voltage level of a signal VWP and also for converting the low level to a voltage level of the signal VEN.

The voltage level of the signal VWP is set to the high level when reading and erasing data, and to 7V when writing data.

The voltage level of the signal VEN is set to the low level when reading and writing data, and to −7V when erasing data.

Figure 3:
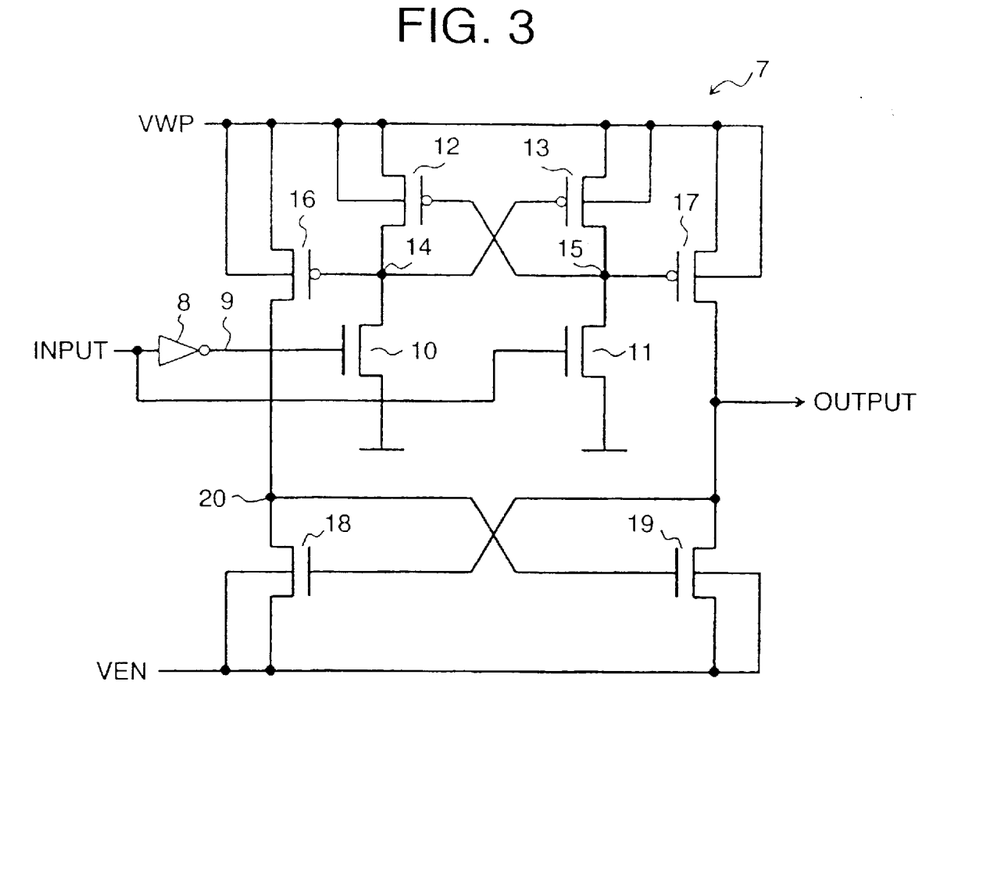
FIG. 3 is a view showing the construction of a level shifter arranged in the sub-bit line selection decoder in FIG. 2.

The level shifter 7 comprises, as shown in FIG. 3, a first level shifting part composed of an inverter 8 for generating a signal having a phase generated by inverting a phase of an input signal INPUT which is the output signal of the AND gate 6, n-channel MOS transistors (hereinafter referred to as NMOSs) 10, 11 for converting the voltage level of the input amplification signal of the high level or low level of the output signal 9 of the inverter 8 to the voltage level of the signal VWP or low level, and p-channel MOS transistors (hereinafter referred to as PMOSs) 12, 13 and a second level shifting part PMOSs 16, 17 and NMOSs 18, 19 respectively receiving two outputs signals of the first level shifting part at nodes 14, 15 for converting the voltage level of the amplification signals thereof from the voltage level of the signal VWP or the low level to the voltage levels of the signal VWP or the signal VEN.

The operation of the nonvolatile semiconductor memory device according to the first embodiment of the invention is described now.

When erasing data, even if the voltage levels of the row address signals ADR (i) to ADR (j) are rendered high level in the sub-bit line selection decoder 5 on the selected row address line, the voltage level of the signal ERN becomes low level when erasing data, so that the voltage level of the output signal of the AND gate 6 becomes low level. The voltage level of the output signal 9 to be supplied to the gate electrode of the NMOS 10 in the level shifter 7 becomes high level so that the NMOS 10 becomes ON. Meanwhile, the voltage level of the output signal 9 to be supplied to the gate electrode of the NMOS 11 becomes low level so that the NMOS 11 becomes OFF. As a result, the voltage level of the outputs signals at the nodes 14, 15 of the first level shifting part becomes low level and the voltage level of the signal VWP.

Accordingly, since the voltage level of the signal at the node 14 to be supplied to the gate electrode of the PMOS 16 is low level, the PMOS 16 becomes ON. Since the voltage level of outputs signal at the node 15 to be supplied to the gate electrode of the PMOS 17 is the voltage level of the signal VWP, the PMOS 17 becomes OFF. Accordingly, the voltage level at a node 20 becomes the voltage level of the VWP and the NMOS 19 becomes ON so that the voltage level of an output signal OUTPUT of the level shifter 7 becomes the voltage level of the signal VEN. The output signal OUTPUT corresponds to the signal BSL.

Even in the sub-bit line selection decoder 5 on non-selected row addresses, the voltage level of the signal ERN becomes the low level when erasing data so that the sub-bit line selection decoder 5 on non-selected row addresses operates in the same manner as the sub-bit line selection decoder 5 on the selected row address. As a result, all the signals BSLs become the voltage levels of the signals VFNs, namely they are all biased to −7V.

Further, the voltage level of the signal WL to be supplied to the gate electrode of the memory cell 3 becomes 13V when erasing data and the voltage level of the signal VAS to be supplied to the source electrode thereof becomes −7V when erasing data while the voltage level of the signal VAW to be supplied to the substrate thereof is biased to −7V. Accordingly, the memory cell 3 becomes ON and the sub-bit line 2 becomes −7V. Further, since the sub-bit line selection transistor 4 becomes OFF, the main bit line 1 becomes in a high impedance state.

Figure 4:
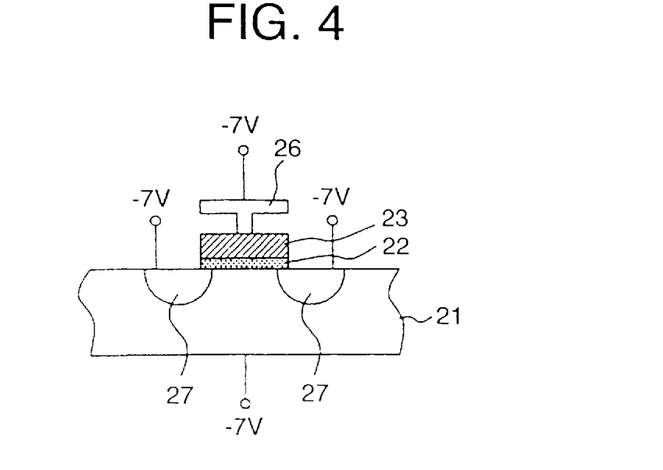
FIG. 4 is a schematic view showing the cross section of a bit line selection transistor of the nonvolatile semiconductor memory device according to the invention.
Figure 5:
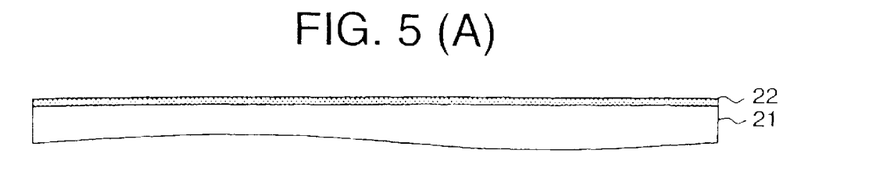
FIGS. 5(A) to (F) are views showing processes of fabricating the nonvolatile semiconductor memory device of the invention.

FIG. 4 is a schematic view showing the cross section of a bit line selection transistor of the nonvolatile semiconductor memory device according to the invention. FIGS. 5(A) to (F) are views showing processes of fabricating the nonvolatile semiconductor memory device of the invention. FIGS. 6(A) to (D) are views showing processes of fabricating the nonvolatile semiconductor memory device of the invention, continued from FIG. 5(F). FIG. 7 is a cross sectional view of the nonvolatile semiconductor memory device of the invention.

A method of fabricating the nonvolatile semiconductor memory device is now described with reference to FIGS. 4 to 7.

First of all, as shown in FIG. 5(A), a silicon substrate 21 is subjected to oxidation at the entire surface thereof so as to form an oxide film 22 serving as a gate oxide film of a memory cell and a gate oxide of a bit-line selection transistor respectively constituting a memory cell array.

As shown in FIG. 5(B), a silicon film 23 for the first gate electrode is formed on the oxide film 22 so as to form a floating gate electrode.

As shown in FIG. 5(C), a multi-layered interlayer film 24 (lower layer oxide film, a nitride film, and an upper oxide film) is formed on the silicon film 23, and a contact hole 25 is formed on the interlayer film 24.

As shown in FIG. 5(D), a silicon film 26 for a second gate is laminated on the interlayer film 24.

As shown in FIG. 5(E), the silicon film 26, the interlayer film 24, the silicon film 23 and the oxide film 22 are sequentially etched.

As shown in FIG. 5(F), ion plantations are effected for providing a source electrode and a drain electrode of the memory cell, thereby forming a diffusion layer 27 for the source electrode and the drain electrode.

Figure 6A:
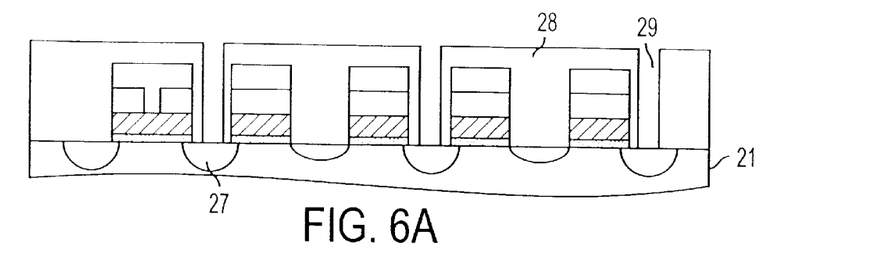
FIGS. 6(A) to (D) are views showing processes of fabricating the nonvolatile semiconductor memory device of the invention continued from FIG. 5 (F)
Figure 7:
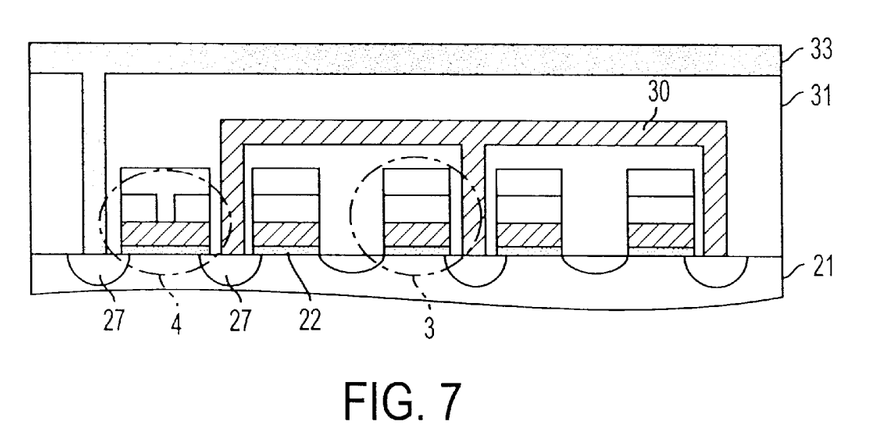
FIG. 7 is a cross sectional view of the nonvolatile semiconductor memory device of the invention.

There after, as shown in FIG. 6(A), an interlayer films 28 is formed and a contact hole 29 is formed on the interlayer film 28.

Figure 6B:
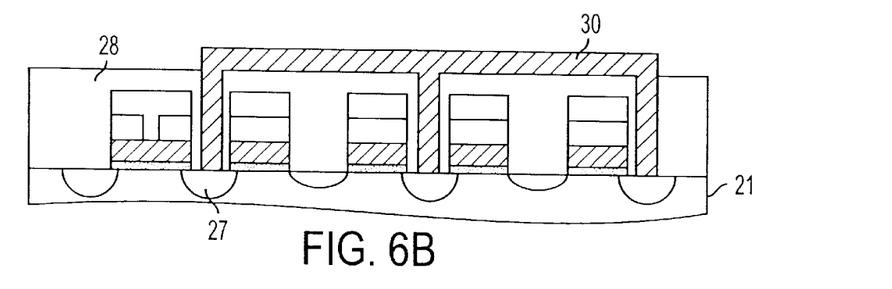

As shown in FIG. 6(B), a first aluminum film 30 for a sub-bit line is laminated on the interlayer films 28, then it is etched. As a result, the sub-bit line is provided.

Figure 6C:
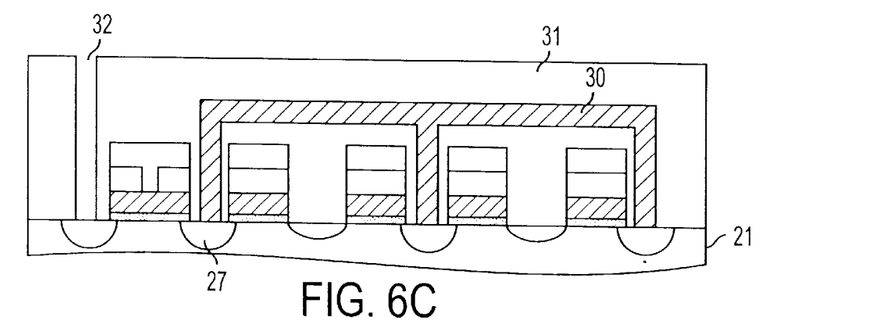

As shown in FIG. 6(C), an interlayer films 31 is further provided on the first aluminum film 30, and a contact hole 32 is formed on the interlayer films 31.

Figure 6D:
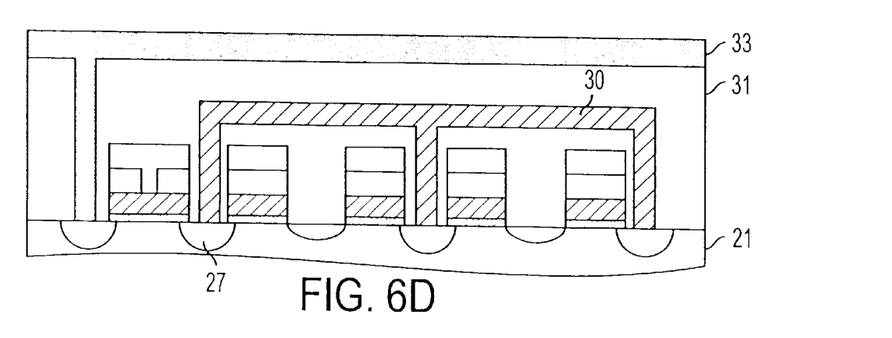

As shown in FIG. 6(D), a second aluminum film 33 for a main bit line is laminated on each interlayer films 31, then it is etched.

As mentioned in the foregoing processes, the bit line selection transistor shown in FIG. 4 and the semiconductor memory device shown in FIG. 7 are respectively obtained.

In FIG. 4, the potential difference between silicon film 23, diffusion layers 27 for a source electrode and the substrate 21 becomes 0V. The voltage appearing on the main bit line becomes not more than 0V considering the capacitance components relative to the signal BSL, the substrate and the signal WL, and the potential difference between the diffusion layers for the drain, the gate electrode and the substrate becomes not more than 7V.

In FIG. 7, as shown in FIGS. 5(A) to 5(F) and FIGS. 6(A) to 6(D), a plurality of memory cells 3, sub-bit line selection transistors 4, first aluminum film 30 serving as sub-bit lines, and the second aluminum film 33 serving as the main bit line are respectively formed on the main bit line 1 and arranged in a matrix.

In such a manner, as illustrated in FIG. 4, as a bias (voltage) of the sub-bit line selection transistor 4, the three voltages that are applied to the gate electrode, the source electrode and the substrate of the sub-bit line selection transistor 4 can be respectively set to −7V, and the voltage applied to the drain electrode can be rendered a high impedance state, so that the potential difference applied to the sub-bit line selection transistor 4 can be minimized.

Further, the maximum potential difference applied to the sub-bit line selection transistor 4 when reading and writing data is 7V that is set between the gate electrode and substrate of the sub-bit line selection transistor 4 when writing data. Accordingly, this potential level can be sufficiently handled with a tunnel oxide film. As a result, the danger from electrical breakdown relating to the gate oxide film of the sub-bit line selection transistor 4 can be precluded.

As set forth above, the sub-bit line selection decoder of the first embodiment of the invention renders the voltage applied to the gate electrode of the sub-bit line selection transistor 4 when erasing data the same as the voltages applied to the substrate of all the memory cells and sub-bit line selection transistor 4 regardless of the selected or non-selected row lines. Accordingly, it is possible to prevent the gate oxide film of the sub-bit line selection transistor 4 from being electrically broken down, and the tunnel oxide film of the memory cell can be used as the gate oxide film, resulting in the prevention of an increase of the number of processes to form the device and an increase of an area occupied by the layout of the memory matrix.

Further, according to the first embodiment of the invention, the gate oxide film of the sub-bit line selection transistor and the tunnel oxide film of memory cell are formed by the same process. Accordingly, when a potential difference applied to the sub-bit line selection transistor is eliminated, the danger from electrical breakdown can be precluded so that the hierarchical bit line structure can be obtained without increasing the number of process.

Figure 8:
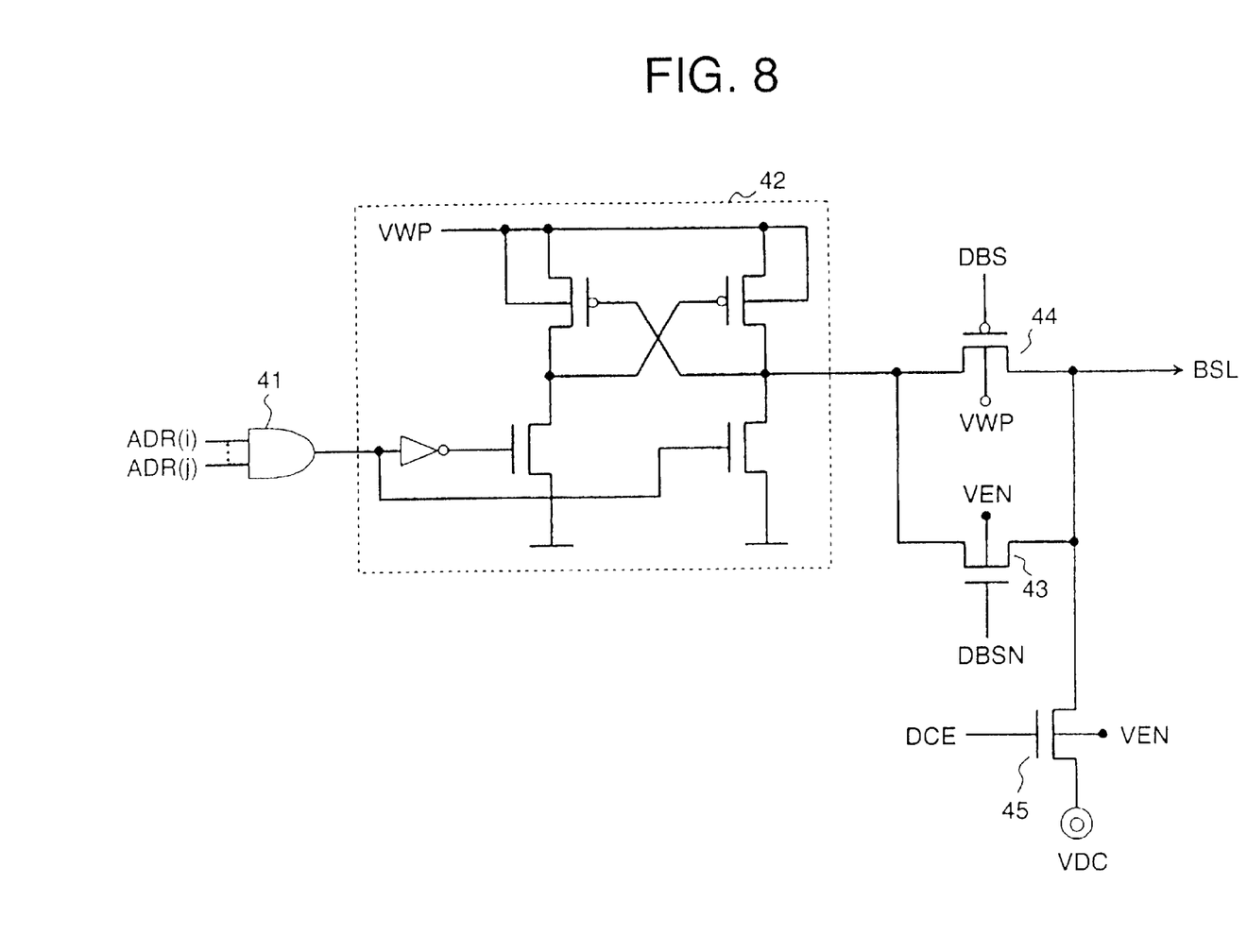
FIG. 8 is a view showing the construction of a sub-bit line selection decoder according to a second embodiment of the invention.

A nonvolatile semiconductor memory device according to a second embodiment of the invention is described now with reference to FIG. 8.

FIG. 8 is a view showing the construction of a sub-bit line selection decoder according to the second embodiment of the invention.

As shown in FIG. 8, a sub-bit line selection decoder comprises an AND gate 41 for receiving a plurality of row address signals ADR (i) to ADR (j) which are transmitted through a plurality of row address lines, a level shifter 42 for converting the voltage level of the output signal of the AND gate 41 to the voltage level of a signal VWP when the voltage level of the output signal of the AND gate 41 is high level, an NMOS 43 and a PMOS 44 constituting a transfer gate for receiving the output signals of the level shifter 42 and outputting a signal BSL, and an NMOS 45 for discharging or converting the voltage level of the signal BSL to the that of the signal VDC.

The nonvolatile semiconductor memory device according to the second embodiment of the invention is described now.

The voltage level of a signal DBS is a signal capable of having the voltage level of the low level when reading and writing data and capable of having the high level only when erasing data. A signal DBSN is a signal capable of having the high level when reading and writing data and capable of having the voltage level of the signal VEN only when erasing data. A signal DCE is a signal capable of having the voltage level of the signal VEN when reading and writing data, and capable of having the high level only when erasing data.

While erasing data, the voltage level of the signal DBS becomes the high level, while the voltage level of the signal DBSN becomes that of the signal VEN so that the transfer gate portion constituted by the NMOS 43 and PMOS 44 becomes OFF. When the voltage level of the signal DCE becomes the high level, the NMOS 45 becomes ON so that the voltage level of the signal BSL supplied to the gate electrodes of all the sub-bit line selection transistors uniformly becomes that of the signal VDC (VDC>VEN) regardless of the selected or non-selected row lines. As a result, voltages to be supplied to the gate electrode, source electrode and substrate electrode can be minimized so that the electric field stress 15 can be suppressed to the minimum. Voltages set in each signal during each operation mode of the nonvolatile semiconductor memory device are described in Table 2.

TABLE 2

|  | reading data | erasing data | writing data |
|---|---|---|---|
| WL | Vcc level | 13 V | −8 V |
| VAS | GND level | −7 V | Hi-Z |
| VAW | GND level | −7 V | GND level |
| main bit line | 1 V | Hi-Z | 5 V/GND |
| VWP | Vcc level | Vcc level | 7 V |
| VEN | GND level | −7 V | GND level |
| DBS | GND level | Vcc level | GND level |
| DBSN | Vcc level | VEN level | Vcc level |
| DCE | GND level | Vcc level | GND level |
| VDC | GND level | 0 to VEN | GND level |
| BSL | Vee/GND | −7 V | 7 V |

The level shifter 42 is substantially the same as the level shifter of first embodiment of the invention, comprising the inverter 8, the output 9 of the inverter 8, the NMOSs 10, 11 and the PMOSs 12, 13. Accordingly, the level shifter 42 operates in the same manner as the level shifter 7.

According to the sub-bit line selection decoder of the second embodiment of the invention, the voltage applied to the gate electrode of the sub-bit line selection transistor 4 is rendered the same as the voltage applied to the substrate of the all the memory cells and the sub-bit line selection transistor 4, regardless of the selected or the non-selected row lines. Accordingly, it is possible to prevent the gate oxide film of the sub-bit line selection transistor 4 from being electrically broken down, and the tunnel oxide film of the memory cell can be utilized as the gate oxide film, resulting in a reduction of the number of process steps to form the device and the area occupied by the layout of a memory matrix.

Further, according to the second embodiment, the number of elements comprising the decoder can be reduced and the voltage applied to the gate electrode of the sub-bit line selection transistor can be set arbitrarily to a level higher than the voltage level of the signal VEN compared with the first embodiment.

Further, the constructions of the sub-bit line selection decoder 5 and level shifter 7 are not limited to the foregoing first and second embodiments.

Further, the construction of the memory cell array is not limited to that of the first embodiment as illustrated in FIG. 1. Still further, various conditions relating to the voltages when reading data from, erasing data from, writing data on the memory cells are not limited to the foregoing first and second embodiments.

Although a case where a high voltage is applied to the gate electrode of the transistor constituting each memory cell is exemplified when erasing data, it is needless to say that the invention can be applied to a case where data is written on the memory cell if a high voltage is applied to the gate electrode when writing data.

The invention is not limited to the foregoing first and second embodiment, but it can be modified variously within the scope of the invention, which is not excluded from the invention.

According to the nonvolatile semiconductor memory device of the invention, the following effects can be obtained.

Since the gate oxide film of the sub-bit line selection transistor is formed the same as the tunnel oxide film of the memory cell, and the potential difference applied to the sub-bit line selection transistor is eliminated, the danger from electrical breakdown can be precluded and a hierarchical bit line structure can be obtained without increasing the number of process steps to form the device.

Since the voltage applied to the gate electrode of the sub-bit line selection transistor when erasing data is rendered the same as that applied to the substrates of all the memory cells and the sub-bit line selection transistor regardless of the selected or non-selected row lines, it is possible to prevent the gate oxide film of the sub-bit line selection transistor 4 from being electrically broken down, and the tunnel oxide film of the memory cell can be utilized as the gate oxide film, resulting in the prevention of increase of the number of process and the area occupied by the layout of the memory matrix.

Still further, the number of elements serving as the decoder can be reduced and the voltage applied to the gate electrode of the sub-bit line selection transistor 4 can be set arbitrarily to a level higher than the voltage level of the signal VEN compared with the first embodiment.

What is claimed is:

1. A nonvolatile semiconductor memory device comprising:

a plurality of memory cells each comprising a first transistor having a first electrode, a second electrode, a gate electrode, and a floating gate electrode between the gate electrode and a first gate oxide film;

a plurality of first data lines each connected to the first electrode of at least one first transistor;

a second data line;

a plurality of second transistors each having a third electrode electrically connected to one of the plurality of first data lines, a fourth electrode electrically connected to the second data line, a gate electrode to which one of a plurality of selection signals is inputted and a second gate oxide film, the second transistor being used to erase data from the memory cells; and a decoder for generating the plurality of selection signals having voltage levels respectively set in response to address information;

wherein the plurality of selection signals are rendered a predetermined voltage level when a high voltage, which is higher than a power supply voltage, is applied to desired gate electrodes of the plurality of memory cells and wherein the first and second gate oxide films have the same thickness.

2. A nonvolatile semiconductor memory device comprising:

a plurality of memory cells each comprising a first transistor having a first electrode, a second electrode, a gate electrode, and a floating gate electrode between the gate electrode and a first gate oxide film;

a plurality of first data lines each connected the first electrodes of at least one first transistor;

a second data line;

a plurality of second transistors each having a third electrode electrically connected to one of the plurality of first data lines, a fourth electrode electrically connected to the second data line, a gate electrode to which one of a plurality of selection signals is inputted, and a second gate oxide film, the second transistor being used to erase data from the memory cells; and a decoder for generating the plurality of selection signals having voltage levels respectively set in response to address information;

wherein a voltage applied to the gate electrode and the third electrode of the second transistor is a voltage applied to the substrate of the second transistor when a high voltage, which is higher than a power supply voltage, is applied to desired gate electrodes of the plurality of memory cell and wherein a thickness of the first and second gate oxide films is the same.

3. The nonvolatile semiconductor memory device according to claim 1, wherein the first gate oxide film of the first transistor and the second gate oxide film of the second transistor are respectively formed in the same process.

4. The nonvolatile semiconductor memory device according to claim 1, wherein the second transistor comprises, a first silicon film provided on the second gate oxide film, an insulating film provided on the first silicon film, and a second silicon film provided on the insulating film and electrically connected to the first silicon film through a contact hole provided on the insulating film.

5. The nonvolatile semiconductor memory device according to claim 2, wherein the second transistor a first silicon film provided on the second gate oxide film, an insulating film provided on the first silicon film, and a second silicon film provided on the insulating film and electrically connected to the first silicon film through a contact hole provided on the insulating film.

6. The nonvolatile semiconductor memory device according to claim 1, wherein the decoder comprises:

a plurality of logical circuits to which the address information and mode signals are inputted, each logical circuit outputting an output signal having a low or high voltage level in response to the address information when the voltage level of the mode signal is the low voltage level, and outputting the output signal having the high voltage level when the voltage level of the mode signal is a high voltage level; and a plurality of level shifters to which the output signals are inputted, each level shifter outputting the selection signal having a voltage level that is the same as or lower than the ground voltage when the voltage level of the output signal is the low voltage level, and outputting the selection signal having a voltage level that is the same as or higher than the power supply voltage when the voltage level of the output signal is the high voltage level.

7. The nonvolatile semiconductor memory device according to claim 2, wherein the decoder comprising:

a plurality of logical circuits to which the address information and mode signals are inputted, each logical circuit outputting an output signal having a low or high voltage level in response to the address information when the voltage level of the mode signal is the low voltage level, and outputting the output signal having the high voltage level when the voltage level of the mode signal is a high voltage level; and a plurality of level shifters to which the output signals are inputted, each level shifter outputting the selection signal having a voltage level that is the same as or lower than the ground voltage when the voltage level of the output signal is the low voltage level, and outputting the selection signal having a voltage level that is the same as or higher than the power supply voltage when the voltage level of the output signal is the high voltage level.

8. The nonvolatile semiconductor memory device according to claim 1, wherein the predetermined voltage is the same as a substrate voltage of the second transistor when data is erased from the memory cells.

* * * * *